(12) United States Patent
Kim

(10) Patent No.: US 7,919,376 B2
(45) Date of Patent: Apr. 5, 2011

(54) CMOS TRANSISTOR AND METHOD FOR MANUFACTURING THE SAME

(75) Inventor: Min-Seok Kim, Siheung-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/344,503

(22) Filed: Dec. 27, 2008

(65) Prior Publication Data

US 2009/0166751 A1     Jul. 2, 2009

(30) Foreign Application Priority Data

Dec. 27, 2007   (KR) .................. 10-2007-0138485

(51) Int. Cl.
*H01L 21/336* (2006.01)

(52) U.S. Cl. . 438/272; 438/212; 438/270; 257/E21.634; 257/E21.635; 257/E21.643

(58) Field of Classification Search ............... 438/199, 438/210, 268, 270, 328, 332, 212, 272; 257/E27.065, E27.109, E21.109, E21.41, 257/E21.612, E21.618, E21.629, E21.633, E21.634, E21.635, E21.643

See application file for complete search history.

(56) References Cited

U.S. PATENT DOCUMENTS

| | | | | |
|---|---|---|---|---|
| 5,378,914 A | * | 1/1995 | Ohzu et al. | 257/369 |
| 5,670,803 A | * | 9/1997 | Beilstein et al. | 257/278 |
| 2003/0075758 A1 | * | 4/2003 | Sundaresan et al. | 257/329 |

* cited by examiner

*Primary Examiner* — Julio J Maldonado
(74) *Attorney, Agent, or Firm* — Sherr & Vaughn, PLLC

(57) ABSTRACT

A method for manufacturing a CMOS transistor includes preparing a silicon substrate provided with a first buried layer, a second buried layer and a body, vertically forming device-isolation films inside the body, forming a first-type well inside the body arranged on the first buried layer, and vertically forming a first source and drain region inside the first-type well, forming a second-type well inside the body arranged on the second buried layer, and vertically forming a second source and drain region inside the second-type well, and vertically forming a recessed gate between the first-type well and the second-type well.

9 Claims, 5 Drawing Sheets

CMOS TRANSISTOR AND METHOD FOR MANUFACTURING THE SAME

The present application claims priority under 35 U.S.C. 119 to Korean Patent Application No. 10-2007-0138485 (filed on Dec. 27, 2007), which is hereby incorporated by reference in its entirety.

BACKGROUND

Generally, SOI (silicon on insulator) substrates employ a silicon layer present on an insulating film arranged on a silicon wafer and thus have a structure in which the insulating layer is buried in the silicon layer. Accordingly, in MOS devices wherein a MOS transistor is formed on an SOI substrate, a body layer of the MOS transistor is isolated due to the buried insulating film and a device-isolation film, thus exhibiting high speed, superior integration level and low power consumption. Depending on the thickness of the silicon layer, SOI substrates are classified into fully-depleted (FD) types and partially-depleted (PD) types.

In comparison, MOSFET devices, which use bulk silicon, have high power consumption and low access speed, as compared to SOI devices. SOI devices operate at low voltages and thus have an advantage of decreased power consumption. In addition, SOI devices are completely insulated from the substrate and thus exhibit a low parasitic capacitance, thereby decreasing leakage current and realizing high-speed transistors. Further, SOI devices are free of latch-up by parasitic devices and have low short channel effects.

However, related SOI devices may be sensitive to the quality of raw materials and may have economic drawbacks due to high manufacturing costs. FIG. 1A illustrates a related FD SOI semiconductor device, and FIG. 1B illustrates a related PD SOI semiconductor device. Referring to FIG. 1A, the fully-depleted SOI semiconductor device has a thin body 10, thus exhibiting little floating body effect and being stable at threshold voltages. However, due to the thin silicon body 10, the related SOI semiconductor device has a low process margin upon forming contacts or silicides and is sensitive to the SOI thickness, thus causing fluctuation in its threshold voltage.

Referring to FIG. 1B, a related partially-depleted SOI semiconductor device has a relatively large silicon body 20, thus having a high process margin and exhibiting little influence of SOI thickness on threshold voltage. However, the related partially-depleted SOI semiconductor device is sensitive to short channel and floating body effects, thus causing variation in device characteristics, as compared to related FD SOI semiconductor devices.

SUMMARY

Embodiments relate to a semiconductor device and a method for manufacturing the same, that may realize a small area, low power consumption and high speed, while reducing raw material costs, by vertically forming SOI semiconductor devices using bulk silicon.

Embodiments relate to a method for manufacturing a CMOS transistor, that includes: preparing a silicon substrate provided with a first buried layer, a second buried layer and a body; vertically forming device-isolation films inside the body; forming a first-type well inside the body arranged on the first buried layer, and vertically forming a first source and drain region inside the first-type well; forming a second-type well inside the body arranged on the second buried layer, and vertically forming a second source and drain region inside the second-type well; and vertically forming a recessed gate between the first-type well and the second-type well.

Embodiments relate to a CMOS transistor that includes: a silicon substrate provided with a first buried layer, a second buried layer and a body; device-isolation films vertically arranged inside the body; a first-type well arranged inside the body on the first buried layer; a second-type well arranged inside the body on the second buried layer; a first source and drain region vertically arranged inside the first well; a second source and drain region vertically arranged inside the second well; and a recessed gate vertically arranged between the first-type well and the second-type well.

DRAWINGS

Figure 1A:
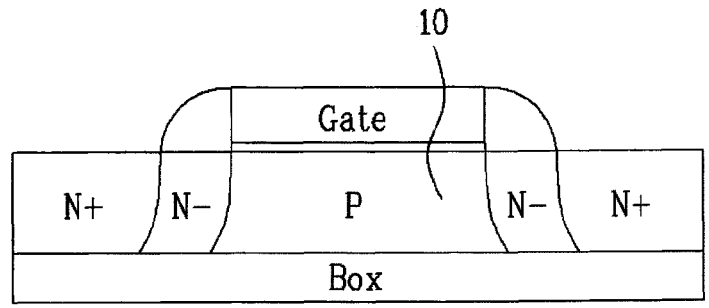
FIG. 1A shows a related FD SOI semiconductor device.
Figure 1B:
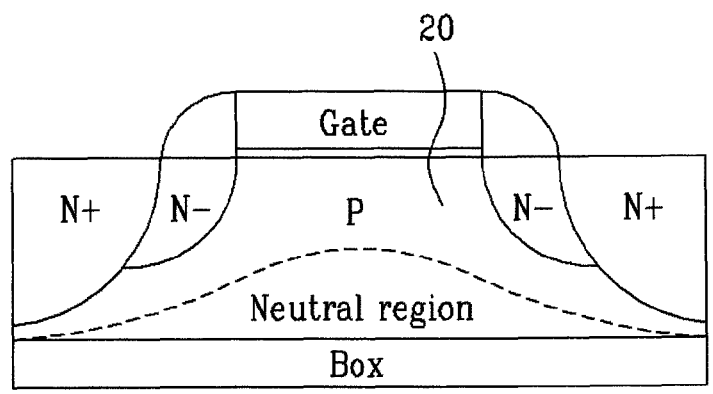
FIG. 1B shows a related PD SOI semiconductor device.

Example FIGS. 2A to 2I are process sectional-views illustrating a method for manufacturing a CMOS transistor according to embodiments.

DESCRIPTION

Example FIGS. 2A to 2I are sectional-views illustrating a method for fabricating a CMOS transistor according to embodiments. That is, example FIGS. 2A to 2I are process sectional-views illustrating a method for fabricating a fully-depleted (FD) SOI CMOS transistor. First, as shown in example FIG. 2A, a silicon substrate 210 may be prepared which includes a p-type buried layer 212 (referred to as a P+ buried layer, PBL), an n-type buried layer 214 (referred to as an N+ buried layer, NBL), and a body 220.

That is, the P+ buried layer 212 may be formed by implanting a p-type impurity ion at a high dose into a region where a PMOS transistor is to be formed on the silicon substrate 210, followed by drive-in diffusion at a high temperature. In addition, the N+ buried layer 214 may be formed by implanting an N-type impurity ion at a high dose into a region where an NMOS transistor is to be formed on the silicon substrate 210, followed by drive-in diffusion at a high temperature. The formation of the P+ buried layer 212 and the N+ buried layer 214 assists in preventing latch-up by parasitic transistors.

The body 220 may be formed by forming an epitaxial layer in a region where the buried layers (for example, P+ buried layer 212 and the N+ buried layer 214) are formed. Then, as shown in example FIG. 2B, a first diffusion region (for example, P+ diffusion region 222) and a second diffusion region (for example, N+ diffusion region 224) which extend to the P+ buried layer 212 and the N+ buried layer 214, respectively, may be formed in the body 220.

For example, the P+ diffusion region 222 may be formed in the following manner. First, an oxide film may be deposited on, or over, the body 220, and a first photoresist pattern may be then formed thereon. The oxide film may be etched using the first photoresist pattern as an etching mask to partially expose the body 220. The portion of the body that is exposed is formed on, or over, the P+ buried layer 212. P+ impurity ions may be implanted into a region where the body is exposed above the P+ buried layer 212 and may then be diffused into the P+ buried layer 212 to form a deep P+ diffusion region 222.

A deep N+ diffusion region 224 may be also formed in the same manner as in the deep P+ diffusion region. Also, the oxide film and the photoresist pattern formed on, or over, the body 220 for the purpose of forming the deep P+ diffusion region 222 and the deep N+ diffusion region 224 may be removed.

Figure 2A:
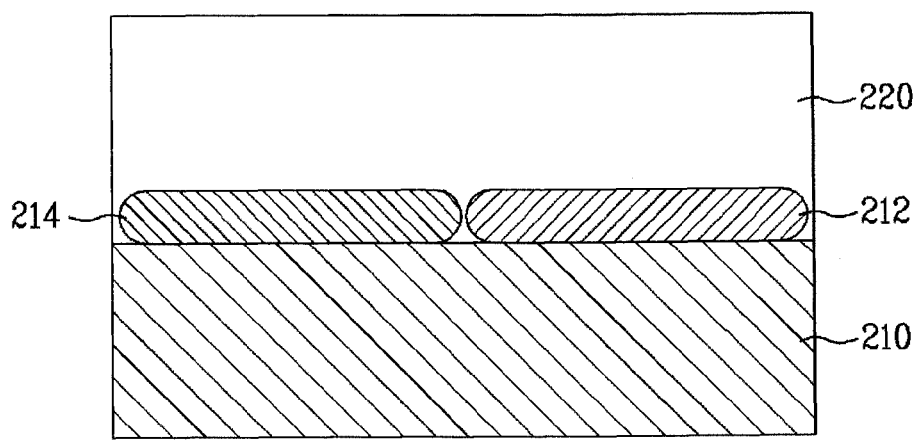
Figure 2B:
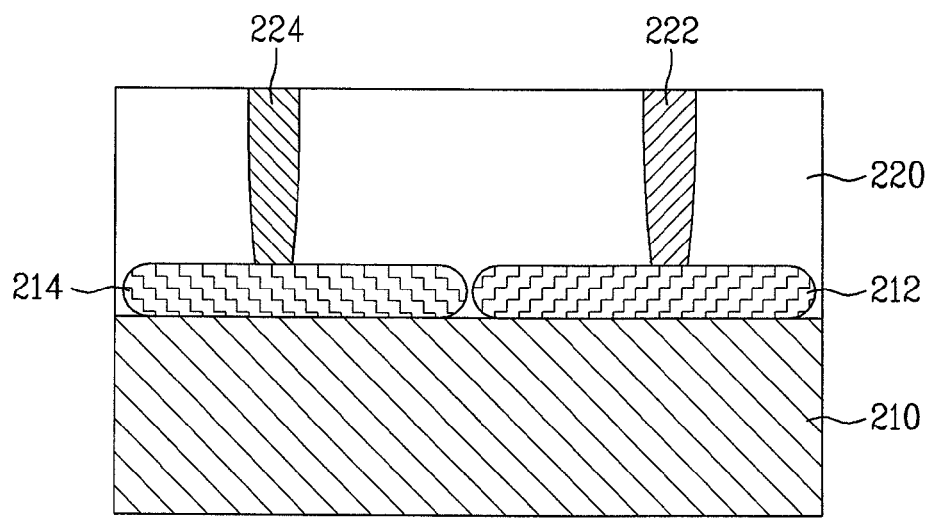
Figure 2C:
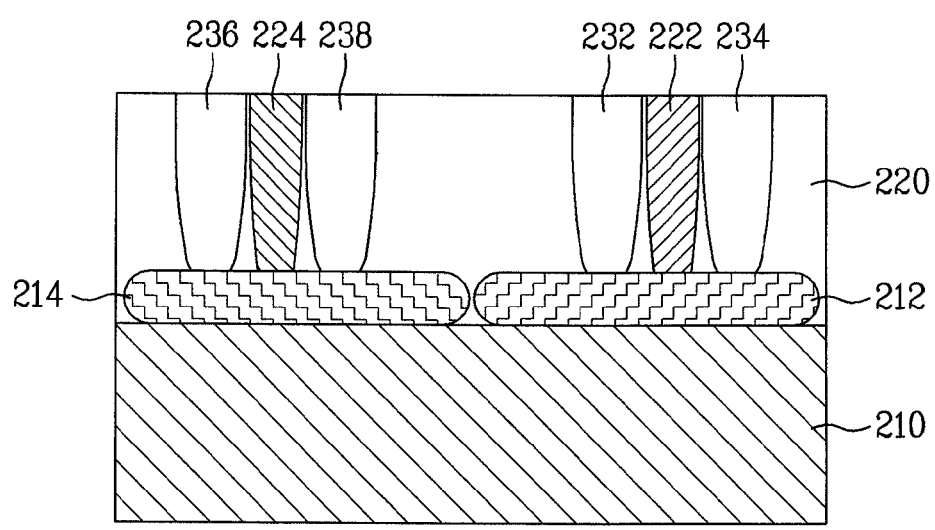
Figure 2D:
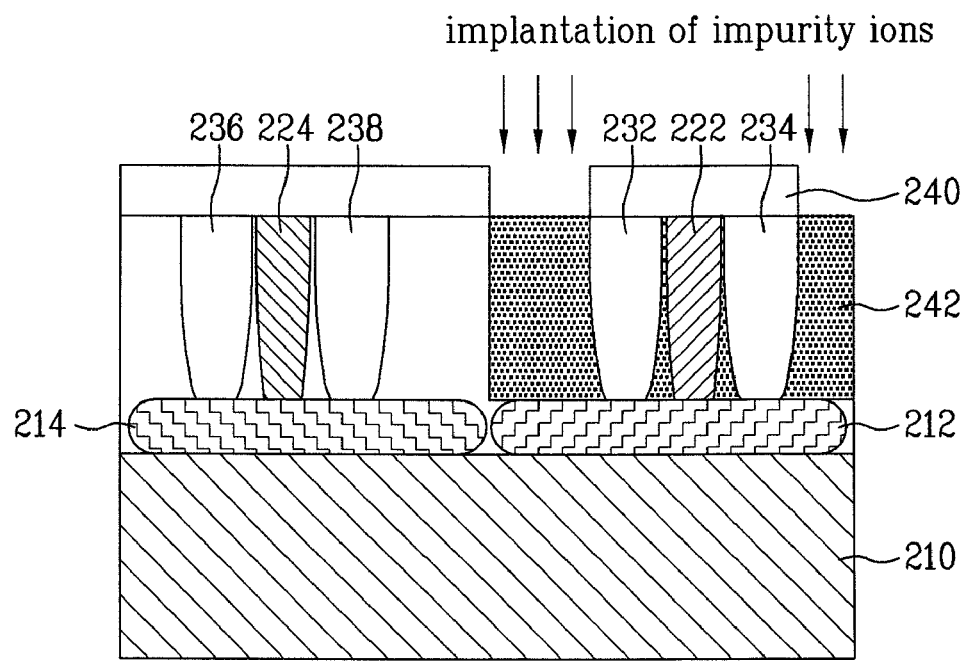

As shown in example FIGS. 2C and 2D, device-isolation films 232, 234, 236 and 238 may be formed such that they extend to the P+ buried layer 212 and the N+ buried layer 214. The formation of the device-isolation films 232, 234, 236 and 238 assists in electrically isolating the CMOS transistor from other devices.

For example, the device-isolation films may be formed by forming a second photoresist pattern on, or over, the body 220, deeply etching the body 220 using the second photoresist pattern as an etching mask to form a deep trench, removing the second photoresist pattern, burying an insulating material in the trench, and performing a planarization process thereon.

The device-isolation films 232, 234, 236 and 238 to isolate the CMOS transistor may be formed on, or over, the P+ buried layer 212 and the N+ buried layer 214, respectively. For example, among the device-isolation films, the first device-isolation film 232 may be formed on, or over, the P+ buried layer 212, and the second device-isolation film 238 may be formed on, or over, the N+ buried layer 214. An FD SOI CMOS transistor according to embodiments may be formed between the first device-isolation film 232 and the second device-isolation film 238.

Then, a low concentration of N-type impurity ions may be implanted into the body arranged on the P+ buried layer 212, followed by performing an annealing process, to form an N-type well 242. For example, the N-type well 242 may be formed by forming a third photoresist pattern 240 on, or over, the body 220, implanting a low concentration of N-type impurity ions into the body 220 formed on the P+ buried layer 212 using the third photoresist pattern 240 as a mask, and performing an annealing process. The third photoresist pattern 240 may be patterned to allow ion-implantation into the body arranged on the P+ buried layer 212.

Figure 2E:
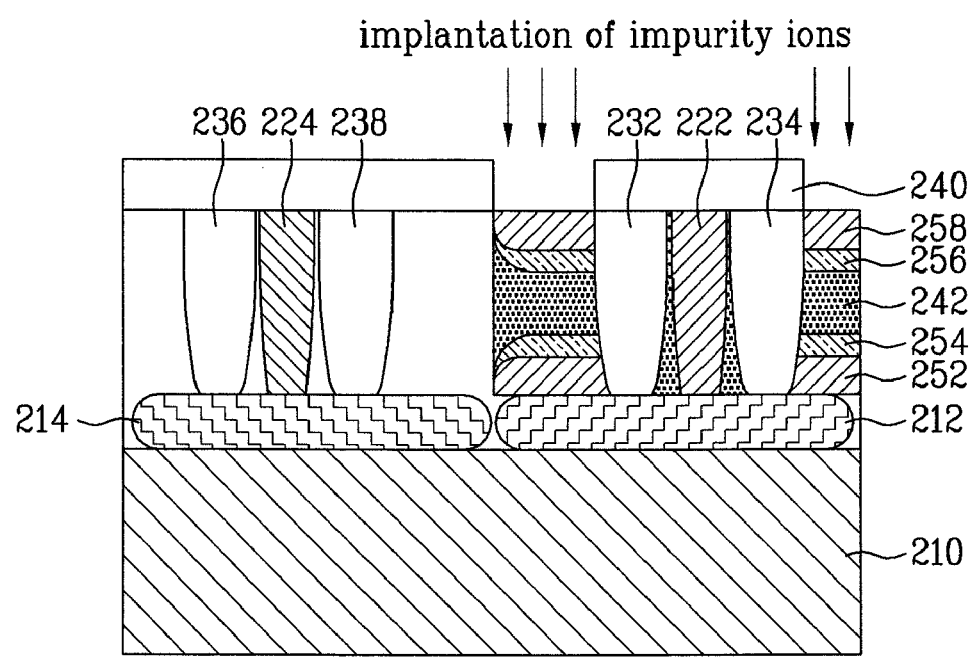

As shown in example FIG. 2E, P-type impurities may be ion-implanted into the N-type well 242 using the third photoresist pattern 240 as an ion-implantation mask. First, a high concentration of P-type impurity ions and a low concentration of P-type impurity ions may be sequentially implanted to form a P+ doped first region 252 and a P− doped second region 254, respectively, in a lower part inside the N-type well 242. Then, a low concentration of P-type impurity ions and a high concentration of P-type impurity ions may be sequentially implanted to form a P− doped third region 256 and a P+ doped fourth region 258, respectively, in an upper part inside the N-type well 242.

The first region 252 and the fourth region 258 may be a source and drain region, and the second region 254 and the third region 256 may be a P drift region. Accordingly, a graded source and drain may be vertically formed in the N-type well 242. The third photoresist pattern 240 may be removed after ion-implantation.

Figure 2F:
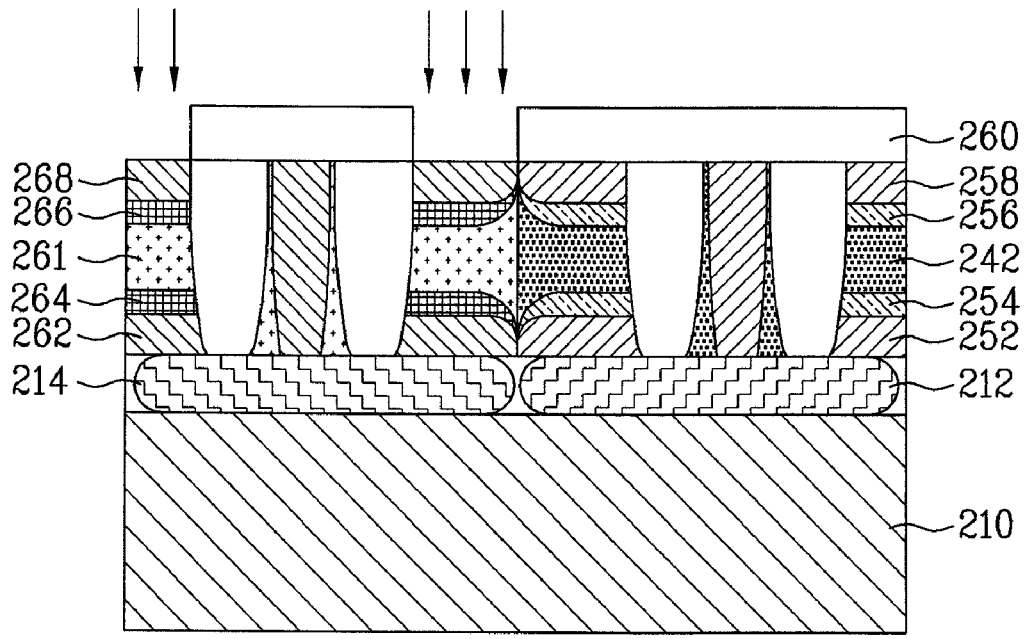

Subsequently, as shown in example FIG. 2F, a low concentration of P-type impurity ions may be implanted into the body 220 formed on, or over, the N+ buried layer 214 and an annealing process may be performed thereon to form an N-type well 261. For example, the N-type well 261 may be formed by forming a fourth photoresist pattern 260 on, or over, the body 220 in order to implant ions into the body 220 formed on the N+ buried layer 214, implanting a low concentration of P-type impurity ions into the body 220 formed on the N+ buried layer 214 using the fourth photoresist pattern 260 as a mask, and performing an annealing process thereon.

Along the fourth photoresist pattern 260, a high concentration of N+ impurity ions and a low concentration of N− impurity ions may be sequentially implanted into the P-type well 261, to form an N+ doped first region 262 and an N− doped second region 264, respectively, in a lower part inside the P-type well 261. In addition, a low concentration of N− impurity ions may be implanted and a high concentration of N+ impurity ions may be sequentially implanted, to form an N− doped third region 266 and an N+ doped fourth region 268, respectively, in an upper part inside the P-type well 261.

The first region 262 and the fourth region 268 may be a source and drain region, and the second region 264 and the third region 266 may be an N drift region. Accordingly, a graded source and drain may be vertically formed. The fourth photoresist pattern 260 may be removed after ion-implantation. As a consequence, the P-type well 262, the source and drain regions 262 and 268, and N drift regions 264 and 266 may be formed in the same manner as described in example FIG. 2E.

Figure 2G:
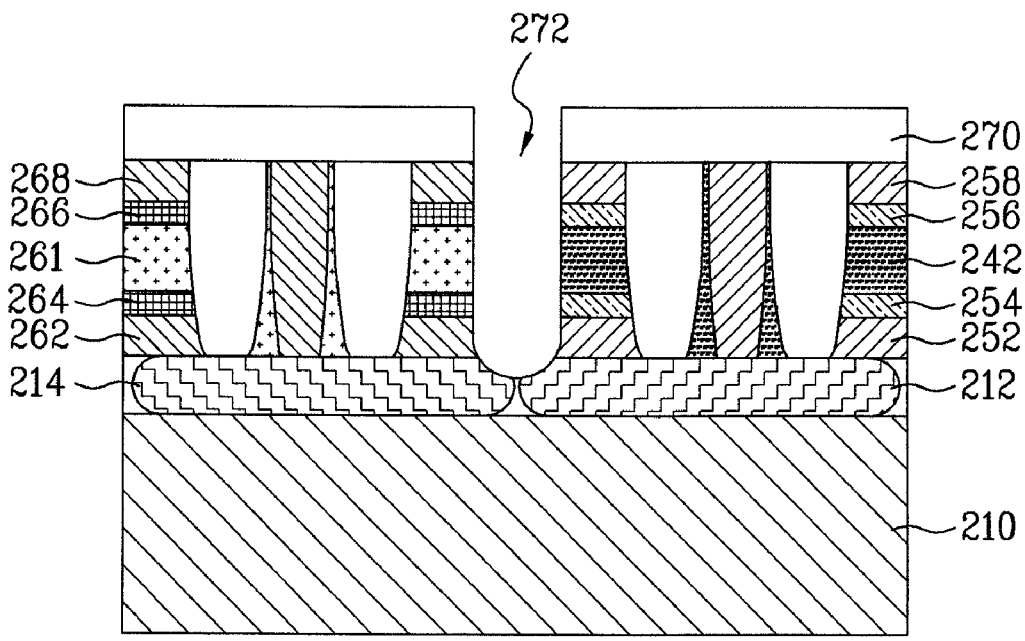

As shown in example FIG. 2G, a gate trench 272 may be formed in the middle of the first device-isolation film 232 and the second device-isolation film 238 inside the body 220. For example, the gate trench 272 may be formed by forming a fifth photoresist pattern 270 on, or over, the body 220 and selectively etching the body 220 using the fifth photoresist pattern 270 as an etching mask. The gate trench 272 may be formed on, or over, the interface between the P+buried layer 212 and the N+ buried layer 214, and the gate trench 272 may be formed such that the bottom thereof is arranged in the buried layers (the P+ buried layer 212 and the N+ buried layer 214).

Figure 2H:
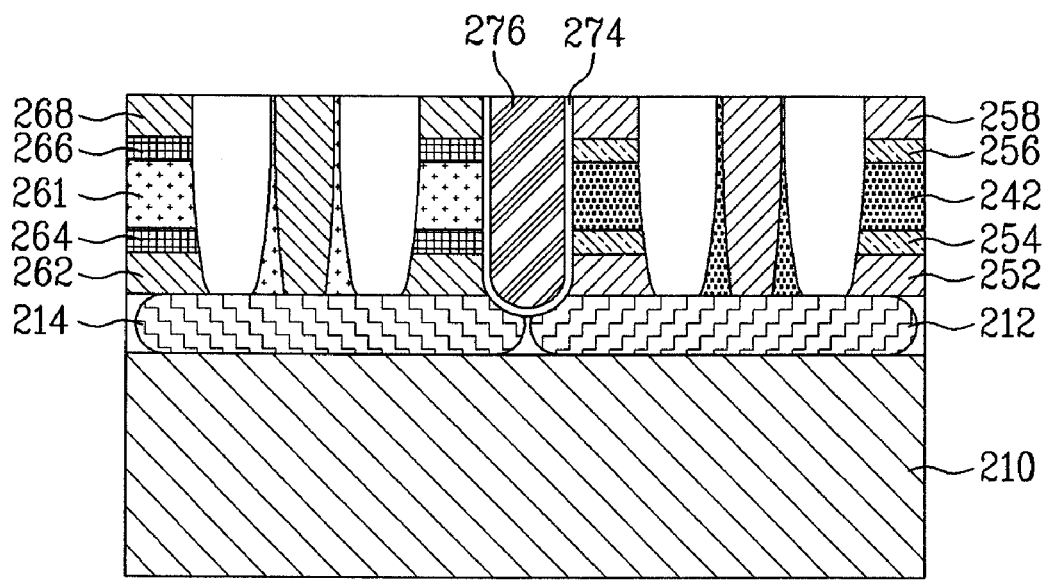
Figure 2I:
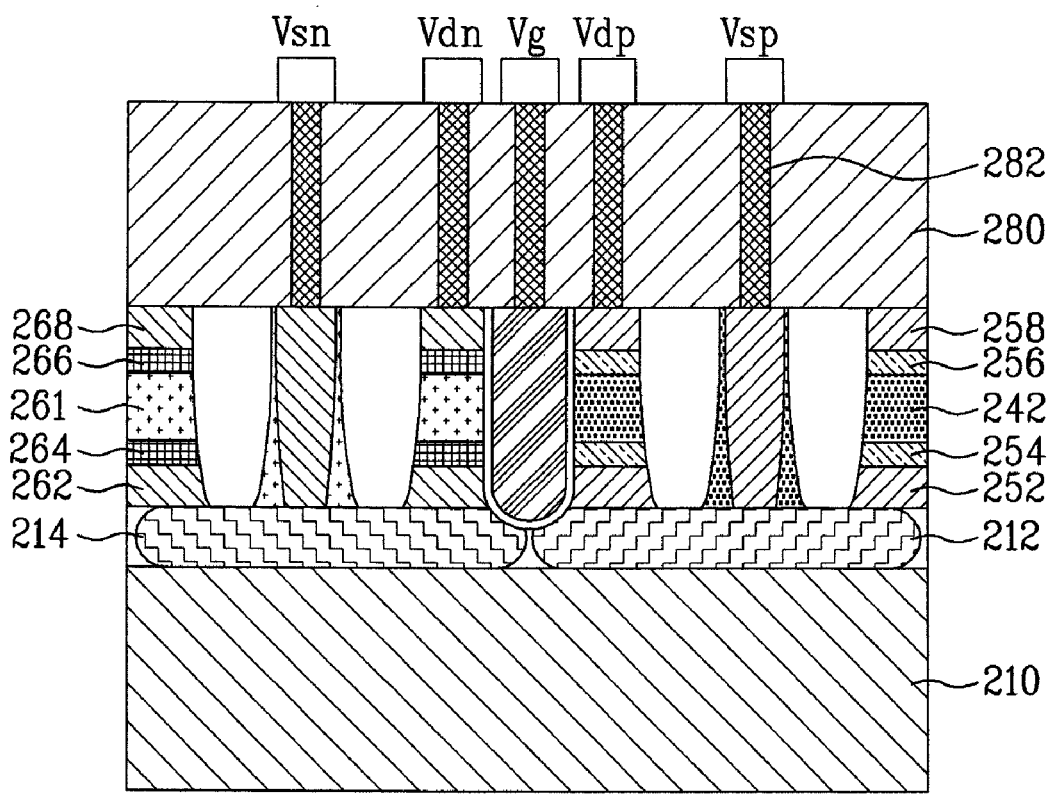

Then, as shown in FIG. 2H, a gate oxide film 274 and a polysilicon 276 may be deposited on, or over, substantially the entire surface of the body 220, to bury the gate oxide film 274 and the polysilicon 276 inside the gate trench 272, and a planarization process (for example, an etch-back or CMP process) may be performed thereon to form a recessed gate. As shown in FIG. 2I, silicide for the contact may be formed, and an interlayer dielectric 280 may then be formed over substantially the entire surface of the body 220. The interlayer dielectric 280 may be etched to form a contact hole and a metal material may then be buried into the contact hole to form a metal line 282.

The CMOS transistor shown in FIG. 2I has FD SOI properties. A ground of PMOS may be formed in the P+ buried layer 212 and a source-ground of NMOS may be formed in the N+buried layer 214. In addition, the NMOS and PMOS arranged at both sides of the recessed gate may be connected to each other through the respective lines to draw VDD (for example, Vdn and Vdp).

As a result, the CMOS transistor shown in FIG. 2I includes the silicon substrate 210 provided with the first buried layer 212, the second buried layer 214 and the body 220; device-isolation films 232, 234, 236 and 238 vertically formed inside the body 220; the first well (for example, an N-well) 242 inside the body 220 on the first buried layer 212; the second well (for example, a P-well) 261 formed inside the body 220 on the second buried layer 212; the first source and drain regions 252 and 258 vertically formed inside the first well 242; the second source and drain regions 262 and 268 vertically formed inside the second well 261; and recessed gates 274 and 276 vertically arranged between the first well 242 and the second well 261.

The first well 242 may be an N-type well and the second well 261 may be a P-type well. The first source and drain region may comprise the P+ source and drain 252 arranged in a lower part inside the N-type well 242, the P− drift region 254 arranged on, or over, the P+ source and drain 252, the P+ source and drain region 258 arranged in a upper part inside the N-type well 242, and the P− drift region 256 arranged under the P+ source and drain region 258.

In addition, the second source and drain region may comprise the N+ source and drain 262 arranged in a lower part inside the P-type well 261, the N-drift region 264 arranged on, or over, the N+ source and drain 262, the N+ source and drain 268 arranged in a upper part inside the P-type well 261, and the N– drift region 266 arranged under the N+ source and drain 268. The CMOS transistor may further comprise: a first doped region 222 where the impurity may be vertically doped to the first buried layer 212 in the body; and a second doped region 224 where the impurity is vertically doped to the second buried layer in the body.

As shown in FIG. 2I, operation of PMOS and NMOS arranged at both sides of the gate can be controlled through the vertical-structure CMOS transistor and one gate, thus minimizing the CMOS semiconductor device area. In the CMOS transistors, the source, body and drain may be vertically formed, and CMOS transistor devices may be isolated from each other through the device-isolation film, to provide an SOI structure. As a result, CMOS transistors that exhibit superior threshold voltage stability, low power consumption and rapid operation can be realized. In addition, based on the vertical structure, the variation in threshold voltage by floating body may be minimized and the process margin upon forming silicide and contact holes to contact metal lines may be maximized. As a consequence, the CMOS transistor according to embodiments may realize a vertical FD SOI CMOS device on a bulk silicon substrate and minimize device area and manufacturing costs.

Furthermore, the P-type buried layer 212 may be connected to the deep P+ diffusion region 222, and the N-type buried layer 214 may be connected to the deep N+ diffusion region 224, thus minimizing resistances of the sources of the PMOS and NMOS through ohm contact with the P-type buried layer 212 and the N-type buried layer 214, respectively, and improving device stability through complete insulation of the devices from the substrate.

As apparent from the fore-going, the CMOS transistor in accordance with embodiments includes a source, body and drain which are vertically formed, thus assisting in isolation of CMOS transistor devices from each other through a device-isolation film, to provide an SOI structure. Based on such a structure, the CMOS transistor may exhibit superior threshold voltage stability, low power consumption, and rapid operation.

In addition, the CMOS transistor according to embodiments includes a thin body which assists in minimizing variations in threshold voltage by the floating body, and assists in maximizing process margins upon forming silicide and contact holes to contact metal lines, based on the vertical structure.

It will be obvious and apparent to those skilled in the art that various modifications and variations can be made in the embodiments disclosed. Thus, it is intended that the disclosed embodiments cover the obvious and apparent the modifications and variations, provided that they are within the scope of the appended claims and their equivalents.

What is claimed is:

1. A method for manufacturing a CMOS transistor, comprising:
    preparing a silicon substrate provided with a first buried layer, a second buried layer and a body;
    selectively implanting a first conductive-type impurity into the body, and vertically diffusing the impurity into the first buried layer to form a first diffusion region;
    selectively implanting a second conductive-type impurity into the body, and vertically diffusing the impurity into the second buried layer to form a second diffusion region;
    vertically forming device-isolation films inside the body;
    forming a first-type well inside the body arranged over the first buried layer, and
    vertically forming a first source and drain region inside the first-type well;
    forming a second-type well inside the body arranged over the second buried layer, and vertically forming a second source and drain region inside the second-type well; and
    vertically forming a recessed gate between the first-type well and the second-type well.

2. The method according to claim 1, wherein preparing the silicon substrate includes:
    selectively implanting P-type impurity ions into the silicon substrate to form the first buried layer;
    selectively implanting N-type impurity ions into the silicon substrate to form the second buried layer; and
    forming an epitaxial layer on the first buried layer and the second buried layer to form the body.

3. The method according to claim 2, wherein vertically forming the second source and drain region includes:
    implanting a P-type impurity ion into the body arranged on the second buried layer to form the second-type well; and
    implanting an N-type impurity ion into the second-type well with different ion concentrations and ion-implantation energies to vertically form the second source and drain region.

4. The method according to claim 2, wherein vertically forming the first source and drain region includes:
    implanting an N-type impurity ion into the body arranged on the first buried layer to form the first-type well; and
    implanting a P-type impurity ion into the first-type well with different ion concentrations and ion-implantation energies to vertically form the first source and drain region.

5. The method according to claim 4, wherein vertically forming the second source and drain region includes:
    implanting a P-type impurity ion into the body arranged on the second buried layer to form the second-type well; and
    implanting an N-type impurity ion into the second-type well with different ion concentrations and ion-implantation energies to vertically form the second source and drain region.

6. The method according to claim 5, wherein vertically forming the second source and drain region includes:
    implanting the P-type impurity ion into the first-type well with different ion concentrations and ion-implantation energies.

7. The method according to claim 6, wherein implanting the P-type impurity ion into the first-type well with different ion concentrations and ion-implantation energies includes:
    sequentially vertically forming a first N+ source and drain region, a first N– drift region, a P-type well, a second N– drift region, and a second N+ source and drain.

8. The method according to claim 4, wherein vertically forming the first source and drain region includes:
    implanting the P-type impurity ion the first-type well with different ion concentrations and ion-implantation energies.

9. The method according to claim 8, wherein implanting the P-type impurity ion the first-type well with different ion concentrations and ion-implantation energies includes:
    sequentially vertically forming a first P+ source and drain region, a first P– drift region, a N-type well, a second P– drift region, and a second P+ source and drain.

* * * * *